United States Patent
Matsuura

(10) Patent No.: US 12,334,417 B2
(45) Date of Patent: Jun. 17, 2025

(54) LEADED SEMICONDUCTOR DEVICE PACKAGE HAVING LEADS WITH DIFFERENT WIDTHS

(71) Applicant: Texas Instruments Incorporated, Dallas, TX (US)

(72) Inventor: Masamitsu Matsuura, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 790 days.

(21) Appl. No.: 17/462,067

(22) Filed: Aug. 31, 2021

(65) Prior Publication Data

US 2023/0068748 A1 Mar. 2, 2023

(51) Int. Cl.
*H01L 23/495* (2006.01)
*H01L 23/482* (2006.01)
*H05K 7/10* (2006.01)

(52) U.S. Cl.
CPC ...... *H01L 23/4951* (2013.01); *H01L 23/4824* (2013.01); *H01L 23/4952* (2013.01); *H05K 7/1046* (2013.01)

(58) Field of Classification Search
CPC ............. H01L 23/4824; H01L 23/4951; H01L 23/49513; H01L 23/49555; H01L 23/4952; H01L 23/49541; H01L 23/4842; H05K 7/1046
See application file for complete search history.

(56) References Cited

U.S. PATENT DOCUMENTS

| | | | | |
|---|---|---|---|---|
| 5,250,841 A | * | 10/1993 | Sloan | H01L 22/32 257/693 |
| 5,977,616 A | * | 11/1999 | Schoenfeld | H01L 23/4951 257/695 |
| 6,130,114 A | * | 10/2000 | Murakami | H01L 29/0657 257/E23.056 |
| 7,572,678 B2 | * | 8/2009 | Corisis | H01L 23/49541 438/123 |
| 7,683,494 B1 | * | 3/2010 | Stortini | H01L 23/49541 257/737 |
| 10,410,996 B2 | * | 9/2019 | Martin | H01L 25/50 |
| 2003/0136573 A1 | * | 7/2003 | Miyaki | H01L 23/49541 174/532 |
| 2009/0166826 A1 | * | 7/2009 | Janducayan | H01L 24/29 257/676 |
| 2014/0306330 A1 | * | 10/2014 | Williams | H01L 23/49551 438/123 |

* cited by examiner

*Primary Examiner* — Khiem D Nguyen
(74) *Attorney, Agent, or Firm* — Dawn Jos; Frank D. Cimino

(57) ABSTRACT

In a described example, an apparatus includes: a package substrate having a die pad configured for receiving a semiconductor die, and having conductive leads spaced from the die pad; a semiconductor die mounted on the die pad, the semiconductor die having bond pads on an active surface configured for making electrical connections; electrical connections coupling the bond pads of the semiconductor die to the conductive leads; mold compound covering a portion of the package substrate, the semiconductor die, and the electrical connections, with the leads extending through the mold compound and having end portions exposed from the mold compound; and the leads having a first portion with a first width and extending with the first width from the mold compound to a second portion having a second width that greater than the first width.

28 Claims, 14 Drawing Sheets

LEADED SEMICONDUCTOR DEVICE PACKAGE HAVING LEADS WITH DIFFERENT WIDTHS

TECHNICAL FIELD

This relates generally to packaging electronic devices, and more particularly to dies in leaded device packages.

BACKGROUND

Processes for producing packaged electronic devices include mounting electronic devices to a package substrate, and covering the electronic devices with mold compound to form packaged devices. The molding processes may be done on unit devices or may be done on multiple electronic devices simultaneously. The electronic devices may be arranged in a strip of devices adjacent to one another, or in a two dimensional array of electronic devices in rows and columns on a package substrate, such as lead frame strips or arrays. Once the packages are complete, the packaged electronic devices are separated from one another. In one method to separate the devices, a saw is used. The saw cuts through the mold compound and through the package substrate materials along saw streets that are defined between the electronic devices to separate the devices. Other cutting tools such as lasers can be used.

After the devices are separated, a trim and form process shapes the leads for leaded packages. The trim step removes excess support material and dam bar structures between leads and surrounding the molded package. These structures provide mechanical support during the semiconductor die mount, wire bonding, and molding processes. Once the support material is removed, the leads are shaped by a press that bends the leads to a desired shape, for example a "gull wing" or "J" shape can be used. The leads can extend from the package body to end portions that are configured to enable mounting the packaged electronic device to a board, and to simultaneously provide a terminal for electrical connection.

Mold compound delamination often occurs in leaded electronic device packages. When a thermal cycle test (TCT) is performed on completed devices, mechanical stress due to thermal expansion of the various materials occurs. In leaded packages with mold compound and where a lead frame was used as a package substrate, delamination defects are observed, where the mold compound pulls away from the lead frame surface. In some cases, during thermal cycle tests or other stress tests, wire pull off defects occur. In a wire pull off defect, a bond between a bond wire and a package substrate lead is broken, causing an open in an electrical connection, and resulting in a scrapped device. Leaded semiconductor device packages with reduced delamination defects are needed.

SUMMARY

In a described example, an apparatus includes: a package substrate having a die pad configured for receiving a semiconductor die, and having conductive leads spaced from the die pad; a semiconductor die mounted on the die pad, the semiconductor die having bond pads on an active surface configured for making electrical connections; electrical connections coupling the bond pads of the semiconductor die to the conductive leads; mold compound covering a portion of the package substrate, the semiconductor die, and the electrical connections, with the leads extending through the mold compound and having end portions exposed from the mold compound; and the leads having a first portion with a first width and extending with the first width from the mold compound to a second portion having a second width that greater than the first width.

DETAILED DESCRIPTION

Figure 1:
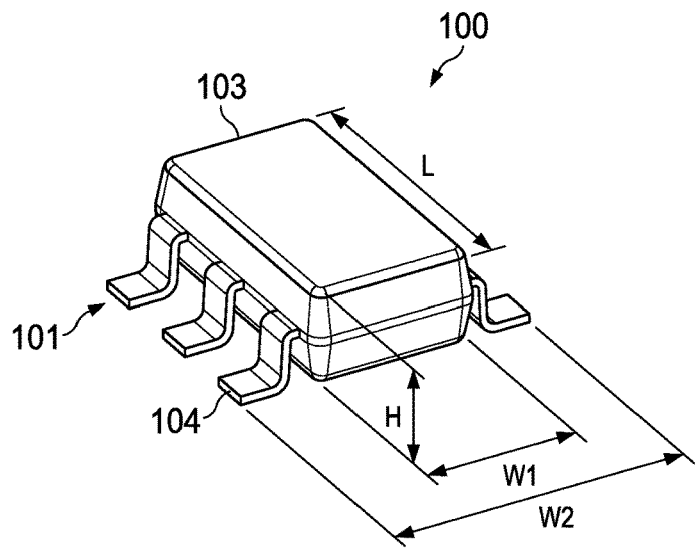
FIG. 1 illustrates, in a projection view, a leaded semiconductor device package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "semiconductor device package" is used herein. A semiconductor device package has at least one semiconductor die electrically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single semiconductor device package. Additional components such as passives can be included in the semiconductor device package. The semiconductor die is mounted to a package substrate that provides conductive leads, a portion of the conductive leads form the terminals for the packaged electronic device. In the arrangements, the leads extend from a package body formed by a mold compound, and thus form a leaded semiconductor device package. The semiconductor die can be mounted to the package substrate with an active device surface facing away from the package substrate and a backside surface facing and mounted to the package substrate. The semiconductor die can be mounted on either the board side, or an opposite side, of the package substrate, that is the semiconductor die can be mounted "face up" with an active surface facing away from a board side of the package, or "face down" with the active surface facing a board side of the package.

The leaded semiconductor device package can have a package body formed by a thermoset epoxy resin in a molding process, or by the use of epoxy, plastics, or resins that are liquid at room temperature and are subsequently cured. The package body may provide a hermetic package for the semiconductor die or dies. The package body may be formed in a mold using an encapsulation process, however, a portion of the leads of the package substrate are not covered during encapsulation, these exposed lead portions provide terminals for the leaded semiconductor device package.

The term "gull wing" is used herein to refer to certain lead shapes used for a leaded semiconductor device package. Gull-wing leads have a shape reminiscent of a gull's wing when viewed in cross section. The leads extend through a package body formed by mold compound to a first bend outside the mold compound, and then from the first bend the leads extend alongside the package body towards a board side (bottom as usually oriented) of the semiconductor device package, then at a point near or just past the bottom of the package body, a second bend is made in an opposite direction from the first bend and the leads then extend away from the package, the end of the leads forming a foot portion configured for mounting to a board. Many leaded semiconductor device packages including some of the arrangements have gull-wing leads. In alternative arrangements, other lead shapes are used.

The term "J-lead" is used herein. A J-lead is a lead that appears like a reversed J shape when viewed in cross section. J-leads extend from a package body formed by mold compound, are bent to extend alongside the package body towards a bottom surface of the package body, and are bent again to form a rounded bottom section that extends beneath the package body, the "J" portion. J-leads have a rounded portion beneath the package body configured for surface mounting on a board using the bottom of the J-lead as a terminal for soldering. Some J-lead semiconductor device packages are referred to as small outline J-lead (SOJ) packages.

The term "DIP" package is used herein. A dual-inline package (DIP) has leads that extend from the mold compound that forms the package body, are bent just outside the mold compound, and the leads extend alongside the package body to pin shaped ends beneath a bottom of the package body, the ends of the leads are used to insert the leads into conductive holes in a circuit board, and can be soldered to the holes to make electrical connections. Alternatively, DIP sockets can be mounted to a circuit board, the DIP sockets having conductive openings that are configured to receive the DIP leads and the sockets can permanently or removably mount a DIP leaded semiconductor device package.

The term "package substrate" is used herein. A package substrate is a substrate arranged to receive a semiconductor die and to support the semiconductor die in a completed semiconductor package. Package substrates useful with the arrangements include conductive lead frames, which can be formed from copper, aluminum, stainless steel, alloys such as Alloy 42, and copper alloys. The lead frames can include a die pad for mounting a semiconductor die, and conductive leads arranged spaced from the die pad for coupling to bond pads on the semiconductor die using wire bonds, ribbon bonds, or other conductors. Lead frames can be provided in strips or arrays. Semiconductor dies can be placed on the strips or arrays, the dies placed on a die pad for each packaged device, and die attach or die adhesive can be used to mount the dies to the die pads. In wire bonded packages, wire bonds can couple bond pads on the semiconductor dies to the leads of the lead frames. After the wire bonds are in place, a portion of the substrate, the die, and at least a portion of the die pad can be covered with a protective material such as a mold compound. In a trim and form process, tools are used to remove material and to shape the leads into a desired shape, where the lead frame leads are completed by removing support structures used during the molding process, and removing other excess lead frame material, and the leads are then shaped in a forming machine, bending the leads to a desired lead shape. Once the packages are complete, a saw can separate the packaged devices from one another by cutting through the mold compound and package substrate material between the semiconductor device packages in saw streets.

A package substrate, such as a lead frame, will have conductive portions on a die side surface. Leads of a metal lead frame are conductive all along the surfaces, while for other package substrate types, conductive lands in dielectric substrate material are arranged and aligned to electrically and mechanically connect to the bond wires used in a leaded package. Electrical connections are made to the leads from a semiconductor die bond pad. The electrical connections can be made using bond wires. Bond wires useful in the arrangements can be of any type used for semiconductor devices, including gold, copper, silver, aluminum, and coated copper bond wire such as palladium coated copper (PCC) bond wire. In alternative arrangements, ribbon bond connections can be used to make the electrical connections.

In forming leaded semiconductor device packages, a mold compound may be used to partially cover a package substrate, to cover the semiconductor die, and to cover the electrical connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state, and then molding can be performed. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the packaged devices. Portions of the package substrate form leads exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This cutting process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

Various leaded semiconductor device packages can be used with the arrangements where the leads extend away from the package body and are shaped to form a portion for soldering to a board. Gull wing lead packages such as small outline transistor (SOT) packages can be used. A dual in line package (DIP) can be used with the arrangements. A small outline package (SOP) can be used with the arrangements. Small outline integrated circuit (SOIC) packages can be used, and small outline J-lead (SOJ) leaded semiconductor device packages can be used with the arrangements.

In the arrangements, a leaded semiconductor device package includes one or more semiconductor dies mounted to a package substrate, such as a metal lead frame. The semiconductor die can be mounted to a die pad configured to support the semiconductor die. Electrical connections are made between bond pads on an active surface of the semiconductor die and a conductive lead of the package substrate. The electrical connections can be made using bond wires, or ribbon bonds. The semiconductor die, the electrical connections, and a portion of the conductive leads are covered with mold compound to form a package body. In the arrangements, portions of the leads that extend from the package body and are exposed from the mold compound are shaped to form terminals for the packaged device. To form the leads to a desired shape, a form tool bends the leads. In order to reduce defects in the completed devices due to mechanical strain on the package and the leads that occur during the form process, the leads have a first portion extending from a package body that have a first width, and a second portion extending from the first portion that has a second width that is greater than the first width. Reducing the width of the first portion of the leads adjacent the package body increases the flexibility of this first portion, reducing the strain on the packaged device during the bend operations in the forming of the leads. Lower stress during lead forming reduces stress on the bonds between the bond wires and the leads inside the package, and reduces delamination defects. Delamination defects that were observed in thermal cycle testing of packaged devices made without the arrangements are reduced or eliminated by use of the arrangements.

FIG. 1 illustrates in a projection view a packaged electronic device 100 in a small outline transistor (SOT) package. SOT packages are used for low terminal count devices such as passive components, transistors, and analog circuits. The leaded semiconductor device package 100 has a package body formed from a mold compound 103, such as thermoset epoxy resin. Other mold compounds, such as resins, epoxies, or plastics can be used. Fillers can be used to increase thermal performance of the molded package. Leads 101 are part of a package substrate (not visible in FIG. 1) that supports a semiconductor die (not visible in FIG. 1, as it is obscured by the package body) within 100. Portions of the leads 101 are exposed from the mold compound 103 and form electrical terminals for the leaded semiconductor device package. The leads 101 extend along the package body and form feet portions 104 at a point beneath the package body so that the leaded semiconductor device package 100 can be mounted to a circuit board or module using surface mount technology (SMT). The leads are bent first at a point just outside the outer surface of the mold compound, to shape the leads so the leads extend alongside the package 100 towards a board side of the package. The leads then are bent again at a point near the bottom of the package body (as oriented in FIG. 1) to form feet portions 104 at the distal ends of the leads for use in surface mounting the package 100 to a board. Leads 101 are gull-wing leads. Package sizes for packaged electronic devices are continually decreasing, and currently can be several millimeters on a side to less than one millimeter on a side, although larger and smaller sizes are also used. Future package sizes may be smaller. A JEDEC standard for a 6 terminal SOT package, as an example package that is useful with the arrangements, is the SOT-23-6 package. An example of a SOT package has a body length L that is about 3 millimeters, and a package body width W1 about 1.75 millimeters, and the total package width W2 (including the leads extended to the ends of the leads) is about 3 millimeters. The package body has a height H of about 1.45 millimeters including the ends of the leads 101.

Figure 2A:
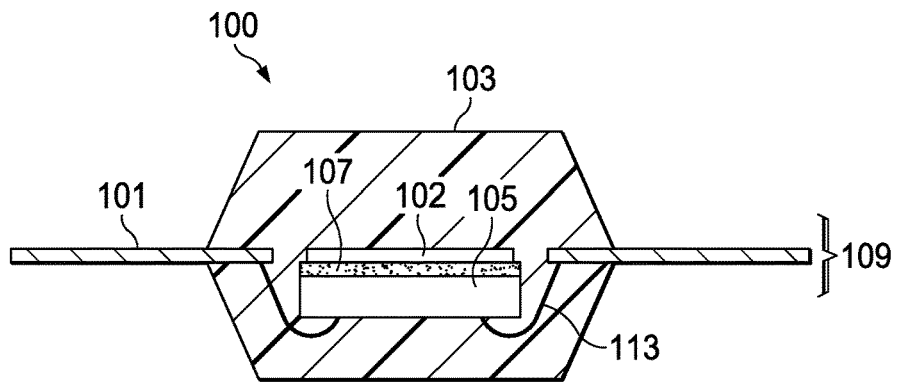
FIGS. 2A-2C illustrate, in a series of cross sectional views, selected steps for forming leads on a leaded semiconductor device package.
Figure 2B:
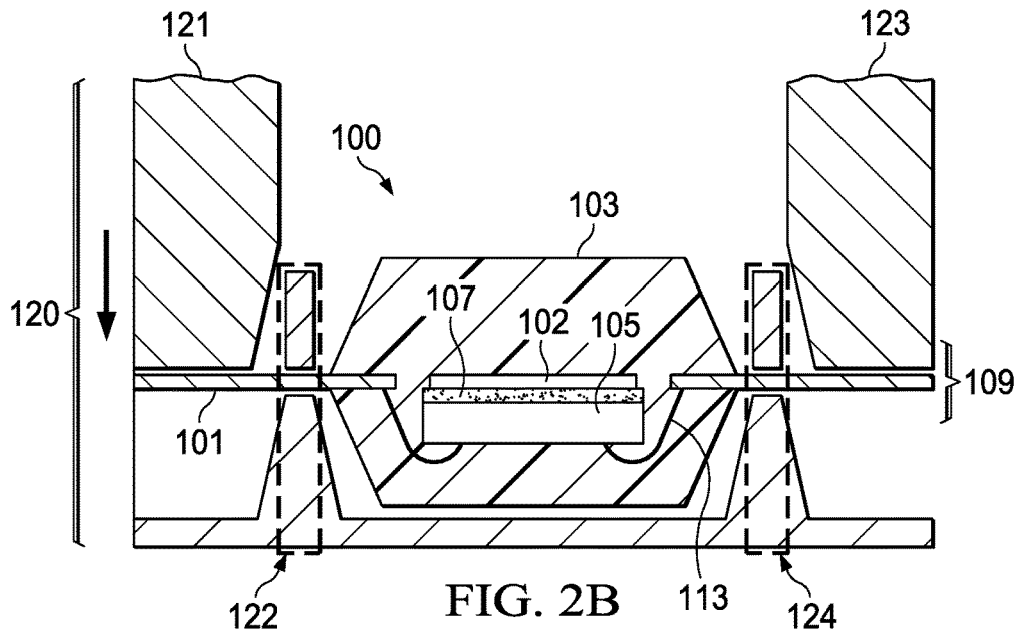
Figure 2C:
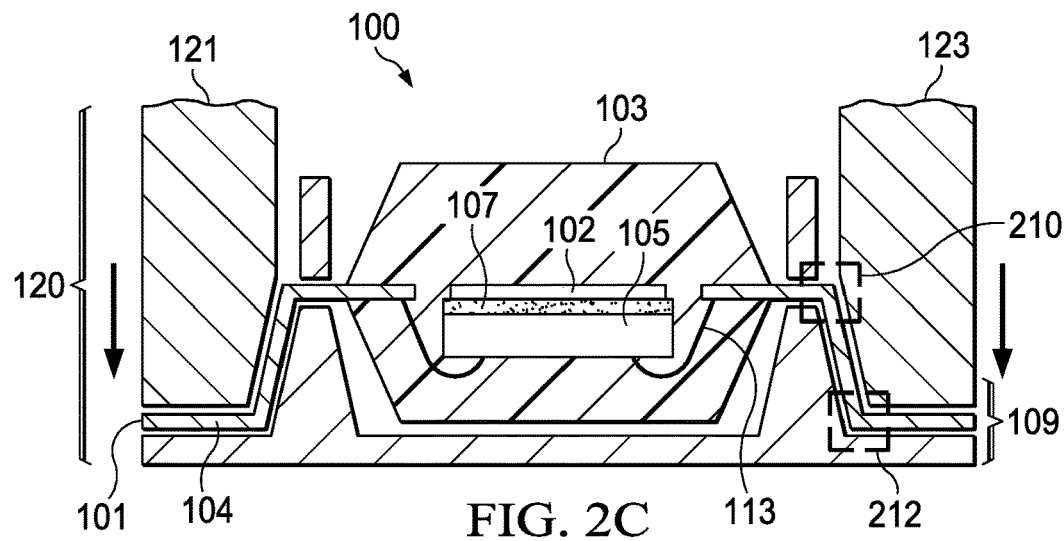

FIGS. 2A-2C illustrate, in a series of cross sections, the lead form operations that shape leads 101. In FIG. 2A, a standard leaded semiconductor device package 100 is shown after a molding process and prior to a lead form step. In FIG. 2A, the package 100 has a semiconductor die 105 mounted by a die attach material 107 to a die pad 102 on package substrate 109. In the illustrated examples, the package substrate 109 has a die pad 102. In an alternative arrangement, a chip on lead package substrate does not have the die pad 102, and the die is mounted to a portion of the leads instead. In the example in FIG. 2A, the semiconductor die 105 is mounted "face down", with an active surface facing a board side of package 100, and with the backside surface of the semiconductor die 105 attached to the die pad 102 on the board side of the package substrate 109, in an alternative arrangement the semiconductor die 105 can be mounted "face up" on the top side surface of the package substrate 109, and with the active surface in a face up arrangement facing away from the board side of the package 100. Depending on other factors, such as thermal dissipation requirements for the completed device, the package substrate 109 can be arranged to receive the semiconductor die 105 on either side. Leads 101 extend from within the mold compound 103 through the outer periphery of the molded package to distal ends.

FIG. 2B illustrates semiconductor device package 100 from FIG. 2A, after additional processing. In FIG. 2B, the package 100 is loaded in a trim form tool 120, which will shape the leads 101. The trim part of the tool is not shown, it involves cutters that remove the dam bar supports that tie the leads together to provide mechanical support during wire bonding and molding operations, which have already been completed. In FIGS. 2A-2C, the trim step has already been performed. The trim form tool 120 has rams 121, 123 that move as shown by the down arrows, and clamps 122, 124 that hold the leads 101 in place. In FIG. 2B the rams 121, 123 are shown ready to form the leads 101 while the tool is using the clamps 122, 124 to hold the leads 101. The trim form tool 120 will form two bends, one bend will be formed near the periphery of the mold compound 103 where the leads 101 of package substrate 109 exit the package body, and a second bend will be formed in the leads 101 near the distal end of the leads 101, to form the feet (see 104 in FIG. 1) of the packaged device.

In FIG. 2C. the trim form tool 120 of FIG. 2B is shown after the rams 121, 123 move downwards as oriented in FIG. 2C and shape the leads 101. The clamps 122, 124 support a portion of the leads 101 adjacent the package body formed by mold compound 103, and form the first bend 210 to bend the leads 101 downwards towards a board side surface of package 100, and to cause the leads 101 to extend along the sides of the package 100. The clamps 122, 124 also have a portion that form the second bend 212 in the leads 101, shaping the leads to extend outwards away from the package body, forming the feet 104 for the completed semiconductor device package 100.

Figure 2D:
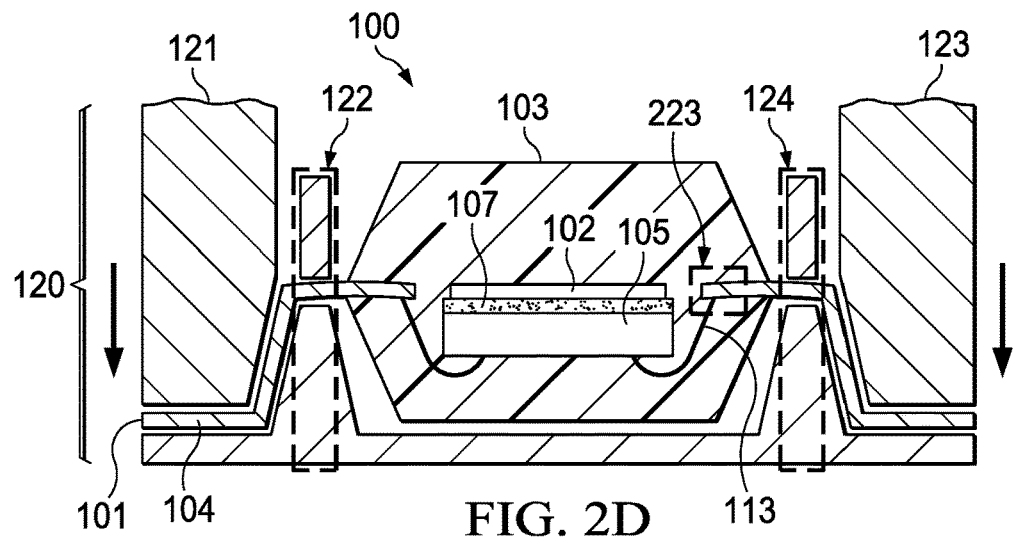
FIGS. 2D-2E illustrate areas where delamination defects can occur during assembly of the semiconductor device packages.

FIG. 2D illustrates an example where during the lead form process, the leads 101 and package substrate 109 bend inside the package body formed by mold compound 103, and may have areas where delamination of the mold compound can occur, and may have wire pull off defects. The delamination and/or wire pull off defects are due to the mechanical stress on the leads during the form process being transmitted into the molded package body. During the forming operation, the lead 101 is bent and mechanical stress can be transferred into the package body of mold compound 103, causing the mold compound 103 to pull away from the lead 101. The area 223 illustrates a possible defect at a portion of a lead 101 where a bond wire connection is made, a stitch connection. The lead has deformation near or including the area 223 where the stitch bond is made, so that the bond wire 113 may pull away from the lead and an open defect may occur during the form operation. In experiments, both delamination and bond wire pull off defects were observed after a lead forming operation.

Figure 2E:
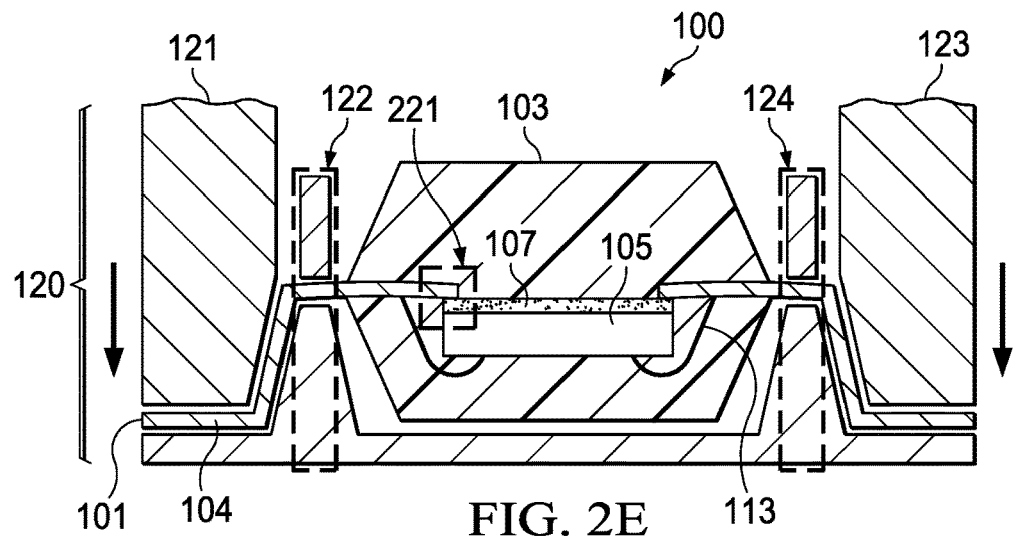

FIG. 2E illustrates an alternative example using a chip on lead package. In this arrangement, there is no die pad and die 105 is mounted on the ends of the leads 101 of the package substrate 109. During the lead form process, the leads 101 and package substrate 109 bend inside the package body formed by mold compound 103, and may have areas where delamination of the mold compound or die attach can occur. During the forming operation, the lead 101 is bent and mechanical stress can be transferred into the package body of mold compound 103, causing the mold compound 103 to pull away from the lead 101. The area 221 illustrates a possible defect at a portion of a lead 101 where a the mold compound can be pulled from the lead. The lead has deformation including the area 221 and the die attach or mold compound may pull away from the lead.

Figure 3A:
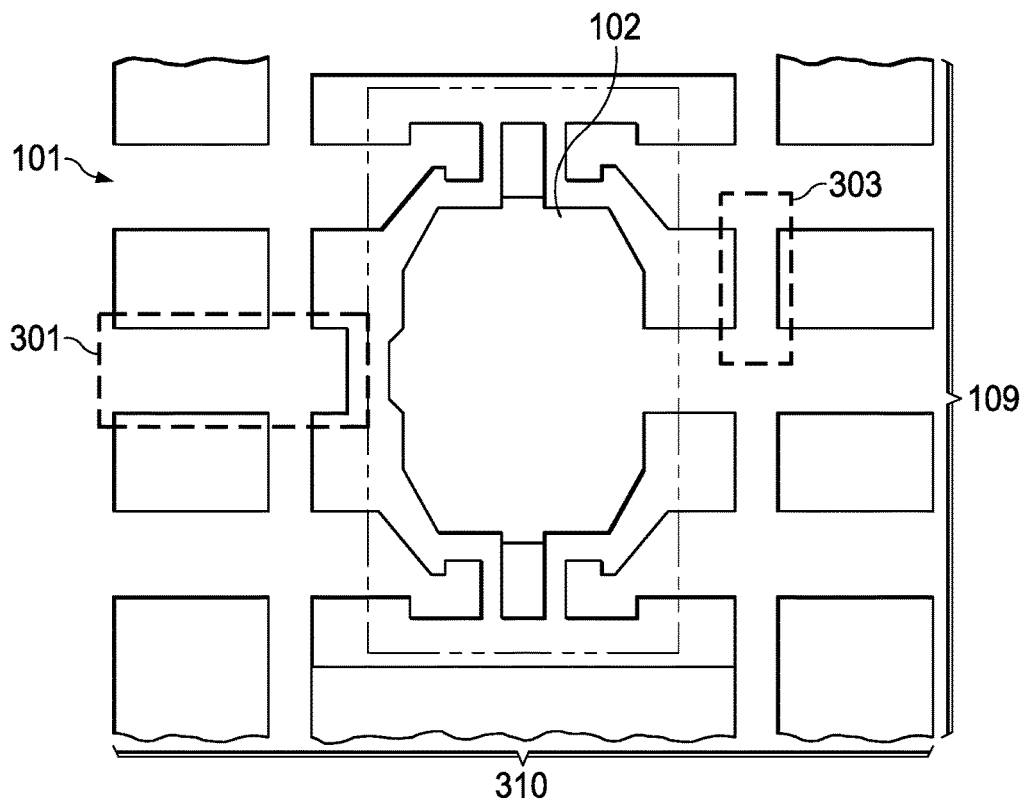
FIGS. 3A-3B illustrate, in plan views, selected steps for forming a leaded semiconductor device package.
Figure 3B:
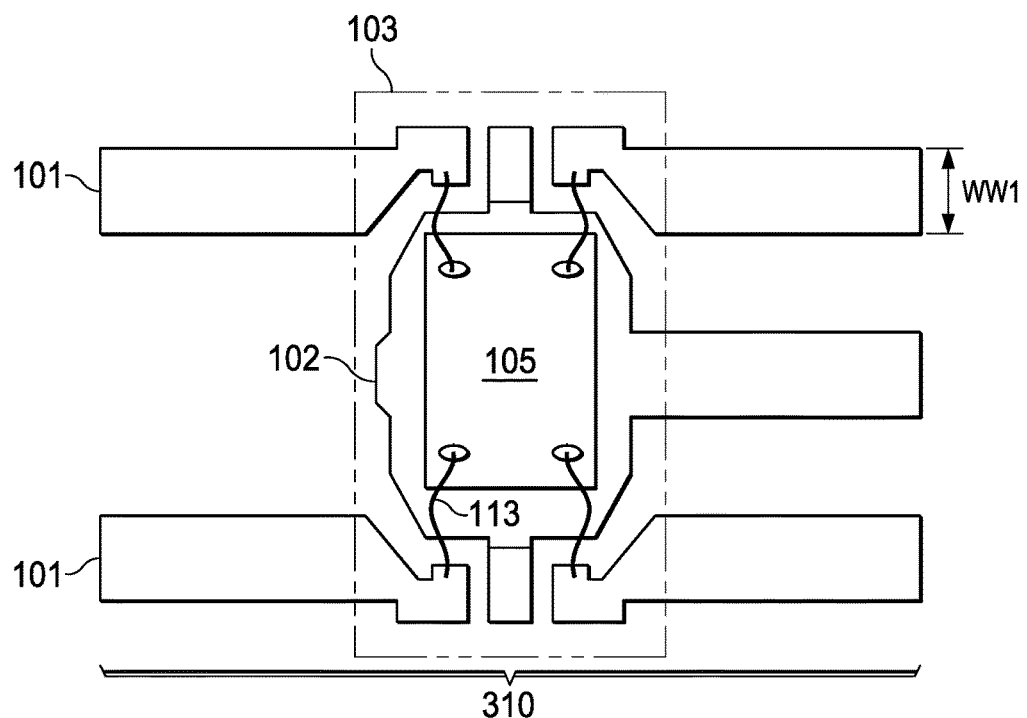

FIGS. 3A and 3B illustrate, in two plan views, processes performed on a unit portion 310 of a lead frame formed on package substrate 109. Leads 101 are shown in FIG. 3A with a die pad 102 configured for receiving a semiconductor die. Tie bars 301, which connect the leads to the remainder of the package substrate 109 for mechanical support, are shown. Dam bars 303 connect the leads together, the mold compound may be restricted from flowing out of a mold by dam bars 303 during molding. The dam bas 303 also couple the leads together are shown to provide additional mechanical support. Dam bars 303, which connect leads 101 to each other, and the tie bar 301, which provide support in spaces between leads 101, will be removed prior to the form steps shown in FIGS. 2A-2C. FIG. 3B shows the unit lead frame 310 after additional processing. Semiconductor die 105 is shown mounted to the die pad 102, and wire bonding make electrical connections in the form of wire bonds 113 from bond pads on the semiconductor die 105 to leads 101. Mold compound 103 forms the package body for the device, and is shown covering the electrical connections, here bond wires 113, and proximal ends of leads 101 adjacent to and spaced from the die pad 102. The leads 101 have a width WW1. FIG. 3B illustrates the lead frame after the trim step, the leads 101 are shown after the tie bar 301 and dam bars 303 are removed from the lead frame in a mechanical cutting operation referred to as "trim." Tools designed to perform the trim and form steps for packaged devices are referred to as "trim form" tools. In FIG. 3B, the encapsulation step is complete, and leads 101 are separated and ready for the form steps shown in FIGS. 2A-2C. The leads 101 in this example have a uniform width WW1.

Figure 4A:
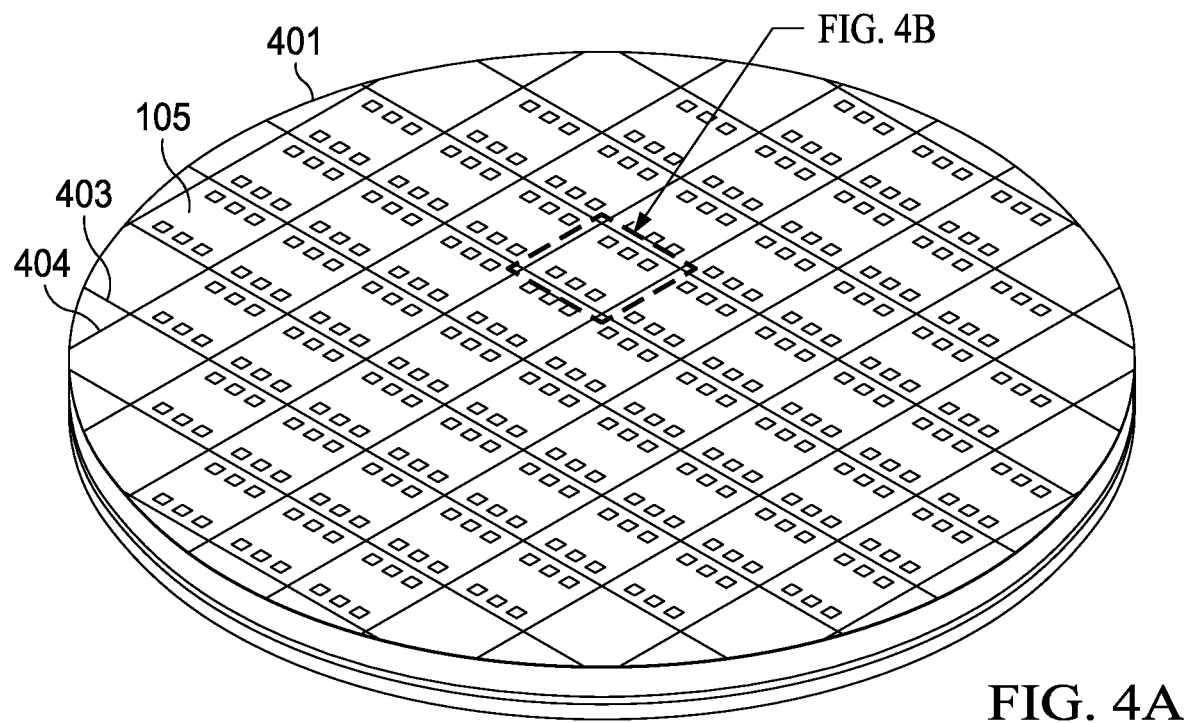
FIGS. 4A-4B illustrate in a projection view and a close up view, respectively, semiconductor dies formed on a semiconductor wafer.
Figure 4B:
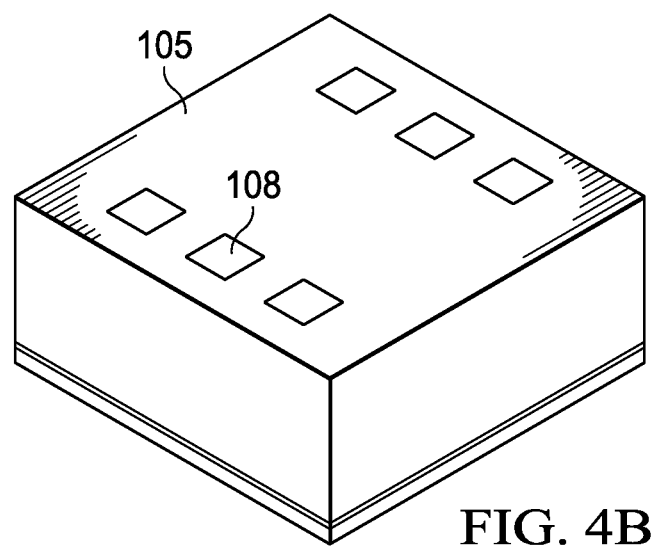

FIGS. 4A-4B illustrate steps used in forming semiconductor dies for use in the arrangements. In FIG. 4A, a semiconductor wafer 401 is shown with an array of semiconductor dies 105 in rows and columns formed on an active surface of the semiconductor wafer 401. The semiconductor dies 105 are formed using manufacturing processes in a semiconductor manufacturing facility, including ion implant, doping, anneals, oxidation, dielectric and metal deposition, photolithography, pattern, etch, chemical mechanical polishing (CMP), electroplating, and other processes for making semiconductor devices. Vertical and horizontal (as the wafer 401 is oriented in FIG. 4A) scribe lanes 403 and 404, which are perpendicular to one another and which run in parallel groups across the wafer 401, separate the rows and columns of the completed semiconductor dies, and provide areas for dicing the wafer 401 to separate the semiconductor dies 105 from one another.

FIG. 4B illustrates a single semiconductor die 105, with bond pads 108, which are conductive pads that are electrically coupled to devices (not shown for simplicity) formed in the semiconductor die 105. The bond pads 108 are at an upper level of metallization layers that lie over the semiconductor substrate of semiconductor die 105, and in examples the bond pads may be formed of copper or aluminum. In addition, platings such as nickel, gold, silver, palladium, tin and platinum can be performed on the bond pads 108 to improve solderability and reduce ion diffusion, and multilayer platings such as ENIG (electroless nickel, immersion gold) and ENEPIG (electroless nickel, electroless palladium, immersion gold) an be used to improve bond strength when the semiconductor die is wire bonded.

When semiconductor dies 105 are mounted to a package substrate 109 and molded, and the leads 101 are subjected to the lead form processes to shape the leads as shown in FIGS. 2A-2C, defects such as mold compound delamination and bond wire pull off have been observed as shown in FIG. 2D. These defects can also occur in testing and particularly in stress tests such as thermal cycle tests. It has been determined that a source of these defects is mechanical stress that is transmitted into the packaged device when the leads are pressed on mechanically to form the leads into the desired shapes, as was described above with respect to FIG. 2D. In the arrangements, these defects are reduced or avoided by the use of leads having multiple widths. By providing a smaller width lead in a first portion of the leads that is bent near the package body formed by the mold compound, mechanical stress on the lead portion that extends into the molded package body is reduced, reducing or eliminating the delamination and the wire pull off defects observed in semiconductor device packages made without the use of the arrangements.

Figure 5A:
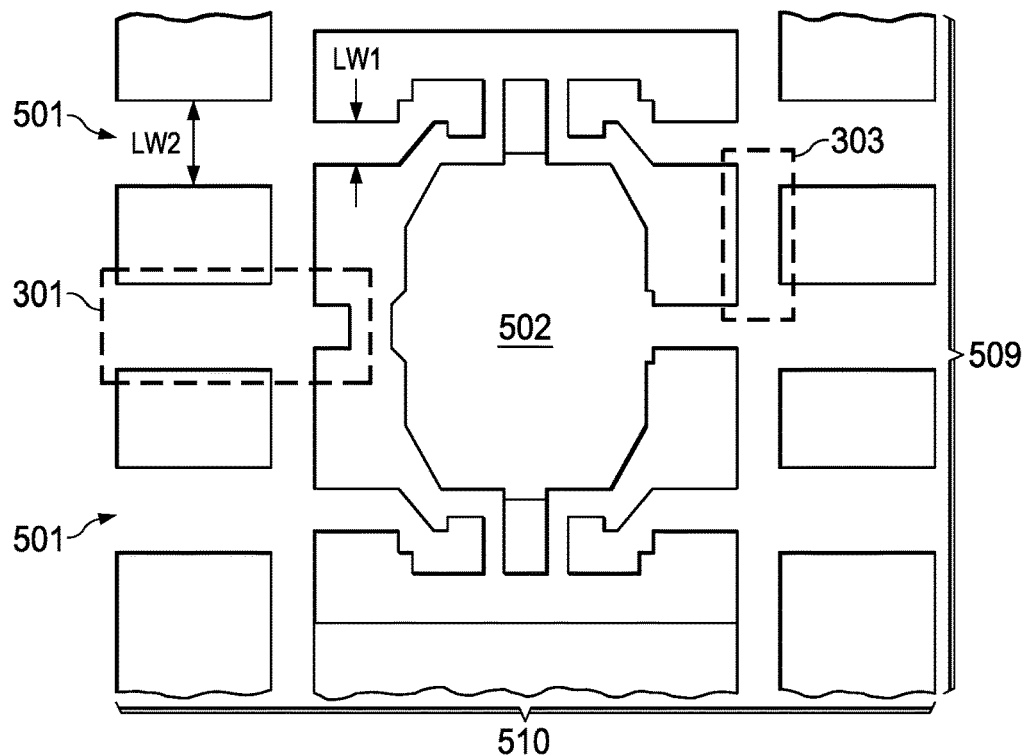
FIGS. 5A-5D illustrate, in a series of cross sectional views major steps in manufacturing a leaded semiconductor device package of the arrangements.

FIGS. 5A-5D show, in a series of plan views, an example process for forming arrangements. FIG. 5A illustrates a unit lead frame 510 that is one unit of a lead frame formed on package substrate 509, which in the examples is a metal lead frame. Metal lead frames used in semiconductor packages are useful with the arrangements, including copper, plated copper, steel, stainless steel, and Alloy 42. In FIG. 5A, a die pad 502 is shown configured to receive a semiconductor die. Leads 501 are shown extending from a proximal end adjacent the die pad 502 extending to distal ends. A first portion of leads 501, has a first width LW1. A second portion of leads 501 extending from the first portion has a second width LW2. The second width LW2 is greater than the first width LW1, lead width LW1 may be 70% to 90% of width LW2, for example. Lead width LW2 may be approximately equal to width WW1 in FIG. 3B. In an example the lead has a width LW1 of 5 mils (a mil is $\frac{1}{1000}^{th}$ of an inch), or about 152.4 microns, and as low as 3 mils. LW2 can be less than 6 mils, for example 5 mils, or less. Smaller widths, to make the portion of leads 501 with lead width WW2 still narrower, can be used. A narrower lead has less stress when the lead is bent by a forming operation, and therefore during bending, the narrower lead will transmit less force into the packaged device. The leads of the lead frame formed on package substrate 509 can be made by a metal stamping or etching operation. Lead frame manufacturers provide both stamped and etched lead frames for use in packaging semiconductor devices. In the arrangements, the lead frames have a narrower lead portion in the portion of the lead that extends from the package body for the first bend in a lead form operation.

The bend stress of a rectangular member, which indicates the force needed to bend the member, can be described as:

$\sigma_{max} = M/Z$, where $Z$ is the section modulus, and $M$ is the bending moment, where $M$ is the product of $W$ and $L$, the length and width of the member. (Equation 1)

The section modulus, Z, can be described as:

$Z = hb^2/6$, where $h$ is the height of a section, and $b$ is the width. (Equation 2)

To increase the bend stress $\sigma_{max}$, indicating that the member is easier to bend, Z should be reduced. As seen from Equation 2, when the width b is reduced, Z is reduced, and then $\sigma_{max}$ is increased. In the arrangements, the leads are narrower at a portion near the edge of a package body where a first bend is made in the form tool. In the arrangements, the width of the first portion of the lead can be reduced by using a narrower lead width, or by making one or more slots or other openings in the lead to reduce the total width in the first portion, or by combining these approaches. The leads in the arrangements will bend with less force required when the total width of the lead in the first portion is reduced, while the other lead dimensions can remain the same or similar width as in prior packages. The mechanical stress on the package and the bond wires within the package that occurs during lead forming will correspondingly be reduced by use of the arrangements. Defects due to the mechanical stress are reduced or eliminated.

FIGS. 5A-5D show, in a series of plan views, certain steps used in forming an arrangement. In FIG. 5A, a unit portion 510 of a lead frame formed on a package substrate 509 has leads 501 surrounding a die pad 502. The die pad is configured to receive a semiconductor die. The leads 501 are tied together by dam bars 303, and have tie bar supports 301 that are removably coupling the leads 501 to the rest of the package substrate. The leads 501 have a first width LW1 in a portion that begins near the die pad, and a second width LW2 that is greater than width LW1 in a portion that extends from the first portion to a distal end of the leads 501.

Figure 5B:
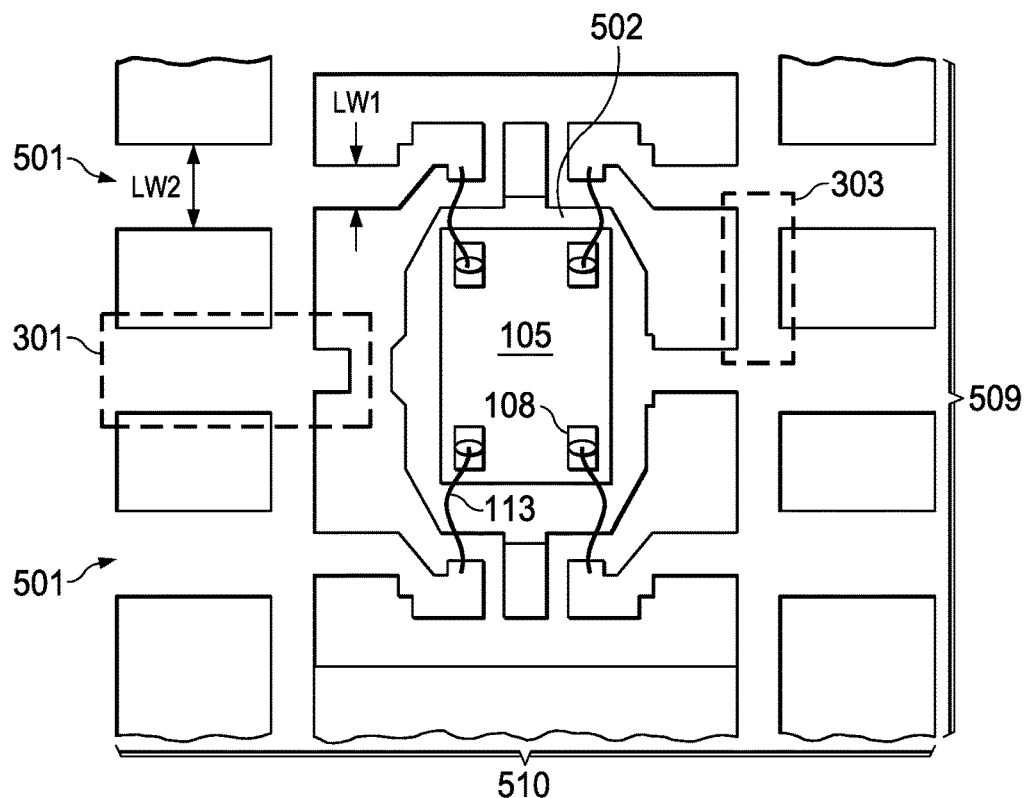

FIG. 5B shows in another plan view the unit portion 510 after additional process steps. A semiconductor die 105 is shown mounted to the die pad 502, for example with a conductive die attach film (not shown as it obscured in this view, see 107 in FIGS. 2A-2D). Bond wires 113 extend from ball bonds on bond pads 108 to leads 501, where a stitch bond is formed on the surface of the leads 501. Dam bars 303 and tie bars 301 remain in place, supporting the leads 501.

Figure 5C:
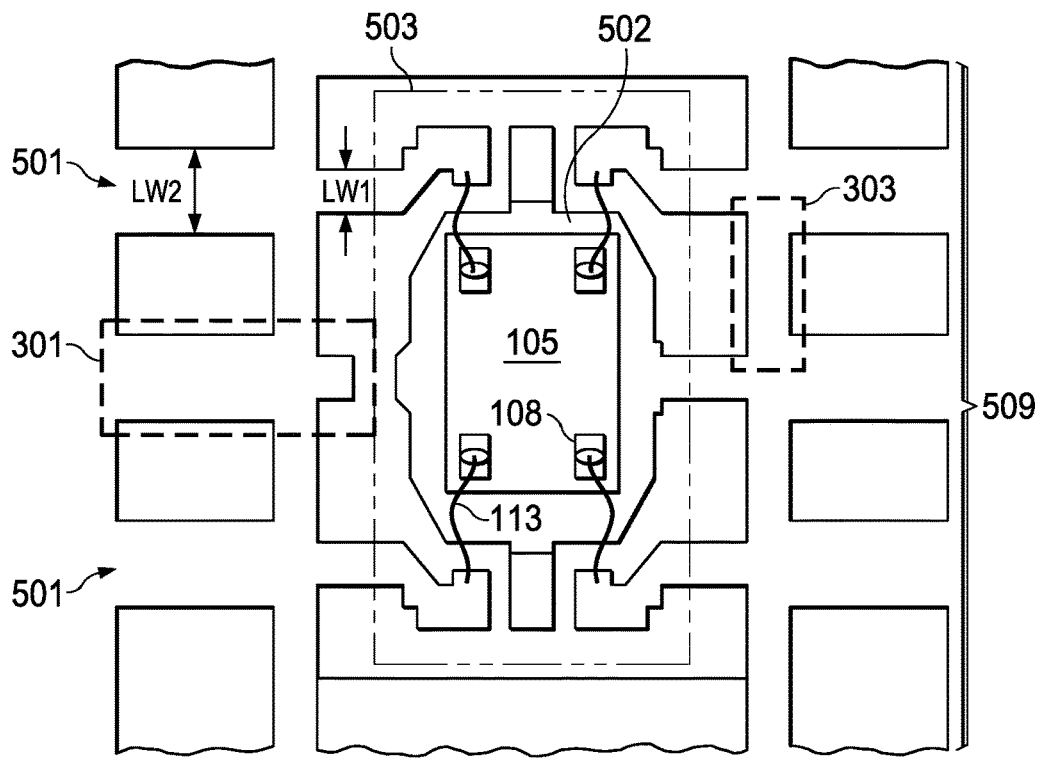

FIG. 5C illustrates in another plan view the unit portion 510 of FIGS. 5A-5B after additional processing. In FIG. 5C, mold compound 103 forms a package body for the packaged device, after an encapsulation step covers the semiconductor die 105, the bond wires 113, and portions of the leads 501 with mold compound. Tie bars 301 and dam bars 303 couple the leads 501 to one another or to the rest of the package substrate 509. The first portion of the leads 501 with width LW1 extends from within the package body formed by the mold compound 103 to a point outside the periphery of mold compound 103. The distance the lead 501 is width LW1, the narrower width, should be sufficient to allow the first bend to be made in the leads 501 by the form tool, the first bend is spaced from the mold compound 103. A spacing distance SP1 is determined. In an example, the distance the mold compound extends has a tolerance of +/−50 microns. A spacing distance SP1 of 75 microns is used, so that even in a worst case where the mold compound 503 extends 50 microns beyond the designed edge, there is at least 25 microns of the lead material that is of the smaller width LW1 that extends form and is exposed from the mold compound 503. Other spacing distances can be used, it is desirable that the leads extend alongside and close to the package body after the bending operation, to keep the package within a small area.

Figure 5D:
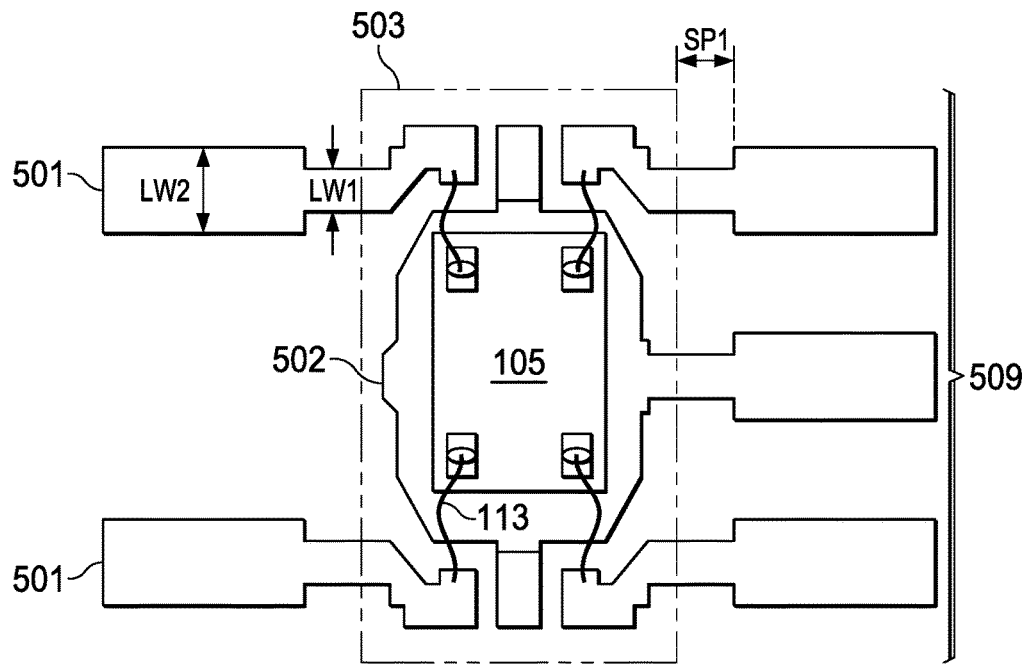

FIG. 5D illustrates the unit portion 510 of FIGS. 5A-5C after additional processing steps. In FIG. 5D, the unit portion 510 is shown after a trim process removes the tie bars 301 and dam bars 303 to prepare the leads 501 for the form process to shape the leads to a desired shape. Leads 501 have a first portion with a width LW1 that is less than a second width LW2 in a second portion. A spacing distance SP1 is determined. In an example, the distance the mold compound extends has a tolerance of +/−50 microns. A spacing distance SP1 of 75 microns is used, so that even in a worst case where the mold compound 503 extends 50 microns beyond the designed edge, there is at least 25 microns of the lead material that is of the smaller width LW1 that extends form and is exposed from the mold compound 503. Other spacing distances can be used, it is desirable that the leads extend alongside and close to the package body after the forming operation, to keep the package within a small area. The spacing distance SP1 needed will depend on the tolerance of a particular manufacturing process but is easily determined in experiments.

Figure 6A:
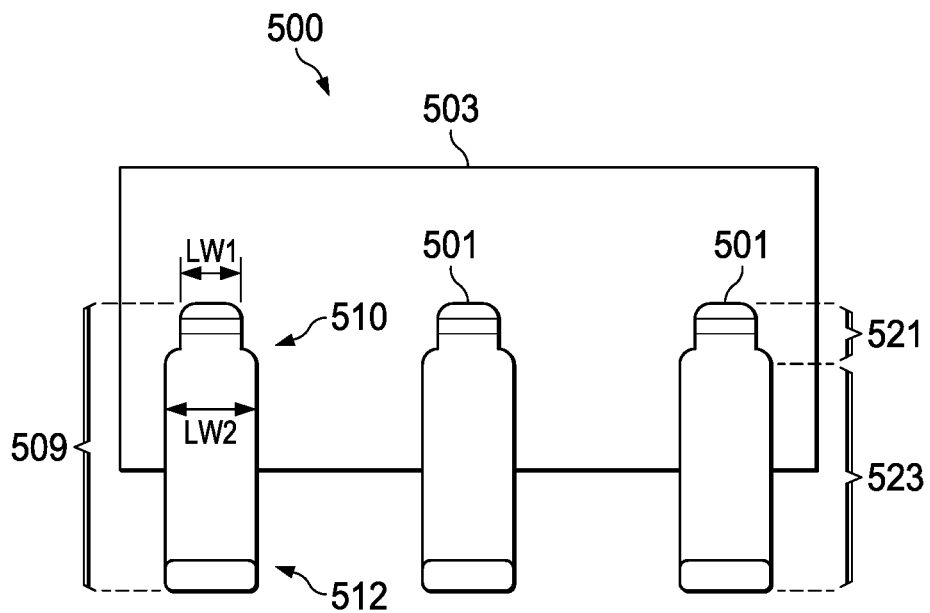
FIGS. 6A-6C illustrate, in a projection views and a cross sectional view, a leaded semiconductor device package of an arrangement.
Figure 6B:
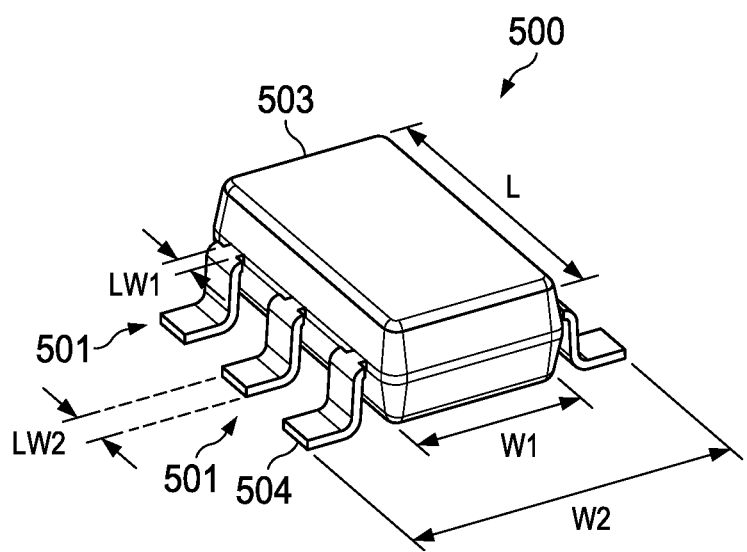
Figure 6C:
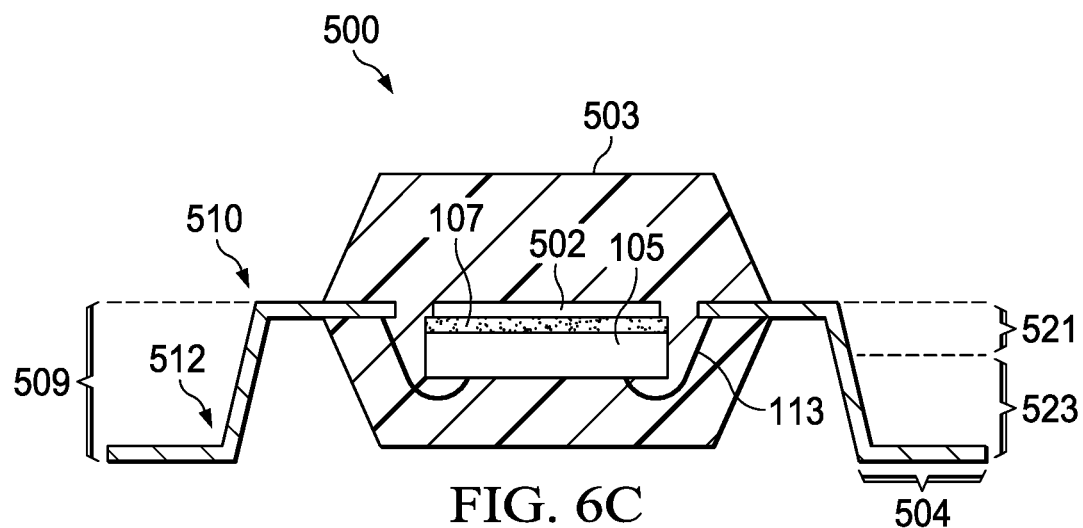

FIGS. 6A-6C illustrate a side view, a projection view, and a cross sectional view, respectively, of a leaded semiconductor device package of an arrangement. In FIG. 6A, a leaded semiconductor device package 500 is shown in a side view. The leaded semiconductor package has leads 501 extending from a package body formed by mold compound 503. The leads 501 have a first portion 521 that have a first lead width LW1 and a second portion 523 with a second lead width LW2. As described above, in an example lead width LW2 is about 6 millimeters, and lead width LW1 is less, for example about 5 millimeters. A first bend 510 is formed in the first portion 521 where the lead has the first lead width LW1. The leads 501 extend from the first bend 510 along the package body towards a board side of the package 500. A second bend 512 is formed in the second portion of the lead 523 and this second bend extends the remaining portion of the leads 501 away from the package body and forms feet 504 on the ends of the leads 501. The feet 504 are arranged to be surface mounted to a printed circuit board using solder. The leads in the leaded semiconductor device package 500 are gull wing shaped leads for a SOT package.

FIG. 6B is a projection view of the leaded packaged semiconductor device 500. In FIG. 6B, the device has a length L, a body width W1 and a total width W2. The leads 501 are shown with first lead width W1 in the portion extending from the mold compound 503, and second width LW2, which is greater than LW1, in a second portion including the feet 504. Use of the arrangements does not change the position of the leads or the overall package dimensions, so that the arrangements can be used with existing package designs and the modifications needed to use the arrangements only affect the lead frame and the leads 501, and no other modifications are needed to use the arrangements. Board designs for prior packages do not require modifications when the arrangements are used.

FIG. 6C illustrates, in a cross section, the arrangement of FIGS. 6A-6B. Leaded semiconductor device package 500 includes mold compound 503, a package substrate 509, in this example a metal lead frame, and leads 501 extending from the mold compound 503. Leads 501 have first portion 521, which as is shown in FIG. 5B, have a first bend 510, the leads extend from the first bend 510 towards the board side of the leaded packaged semiconductor die 500 (the bottom side as oriented in FIG. 6C). Semiconductor die 105 and die attach 107 are shown mounted to the package substrate 509, which in the example illustrated is a metal lead frame. Bond wires 113 form electrical connections between the semiconductor die 105 and leads 501. The leads 501 have second bend 512 in second portion 523, the leads extend from the second bend away from the package body formed by mold compound 503, and the distal ends of the leads 501 form feet 504, which are configured for mounting to a system board.

Figure 6D:
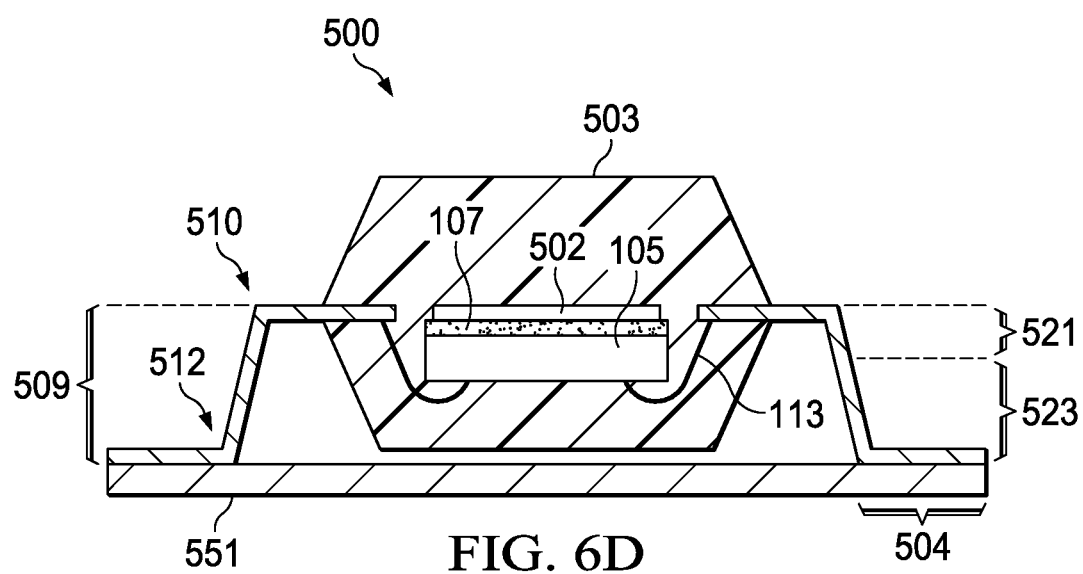
FIG. 6D illustrates a leaded semiconductor device package of an arrangement mounted to a circuit board.

FIG. 6D illustrates in a cross section the arrangement of FIGS. 6A-6C after the leaded semiconductor device package 500 is mounted to a circuit board 551. In the example of FIGS. 6A-6D, the leads are gull wing shaped and have two bends to form feet at the ends. The feet 504 of leads 501, which extend from the package body formed by mold compound 503, are soldered to the circuit board 551. The feet 504 have the lead width LW2, as shown above, which is wider than the width LW1 in the first portion of the leads, and the feet 504 provide mechanical connection and electrical connection between the leaded semiconductor device package 500 and the circuit board 551.

By providing lead frame leads with a first width in a first portion that is extends from the package body that is less than a second lead width in a second portion, and by making the first bend in the leads including part of the first portion, the arrangements reduce the mechanical stresses on the mold compound interface to the package substrate, and the stress on the stitch bonds to the leads of the package substrate during assembly of the packaged devices, reducing delamination and wire pull off defects in the leaded semiconductor device packages.

Figure 7A:
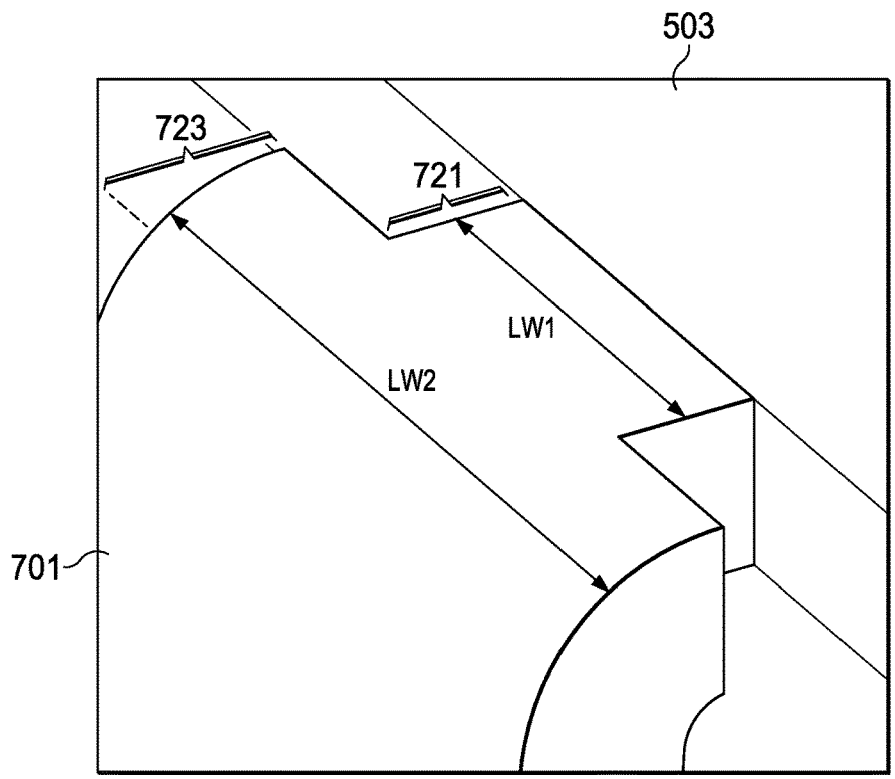
FIGS. 7A-7D illustrate various lead shapes for use with the arrangements.

FIGS. 7A-7D illustrate, in projection views, portions of leads used in example arrangements, where the arrangements vary in how the total thickness of the first portion of the leads is reduced. FIG. 7A illustrates a lead 701 having a shape similar to the example leads 501 in the example of FIGS. 6A-6D, with the first portion 721 of lead 701 having a lead width LW1 that is less than the second portion 723 with a greater lead width LW2. Lead 701 has the first portion 721 extending from the package body formed of mold compound 503. As described above, use of the narrower portion of the leads 701 in the first portion 721 that extends from the package body formed by mold compound 503 reduces stress on the package during the form operations (when compared to lead form operations in prior packages and lead shapes). Lead width LW2 can be, for example, about 5-7 mils, and the smaller lead width LW1 can be, for example, less than about 5 mils, and can be less than 90% of the width of LW1. Other lead widths can be used.

Figure 7B:
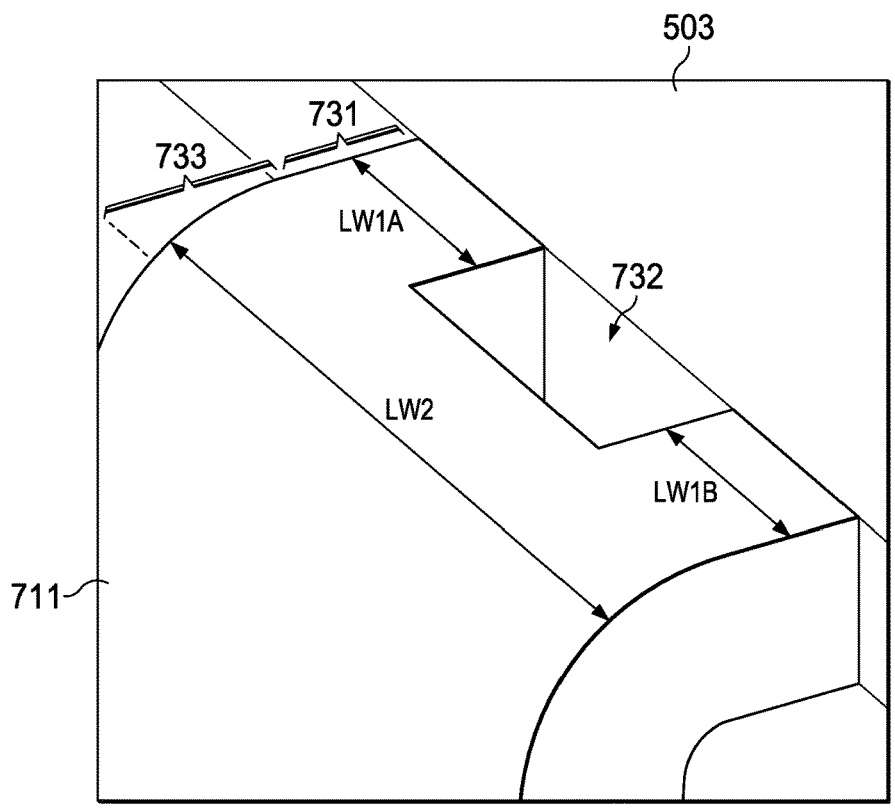

FIG. 7B illustrates in a projection view a close-up of leads 711 in an alternative arrangement. In FIG. 7B, the lead widths in the first portion 731 are reduced by a slot 732 that cuts through a central portion of the lead, reducing the total lead width, which is now the sum of two smaller widths, LW1A and LW1B. The second portion 733 of lead 711 has the larger width LW2. The sum of the two smaller widths LW1A and LW1B can be about the same, or less, than width LW1 in FIG. 7A, and is less than the larger lead width LW2. Slot 732 can be a square, rectangular, oval or circular shape when seen from a top view, and use of the slot 732 reduces the total width of the lead 711 in the first portion 731, by removing lead material in the first portion 731.

Figure 7C:
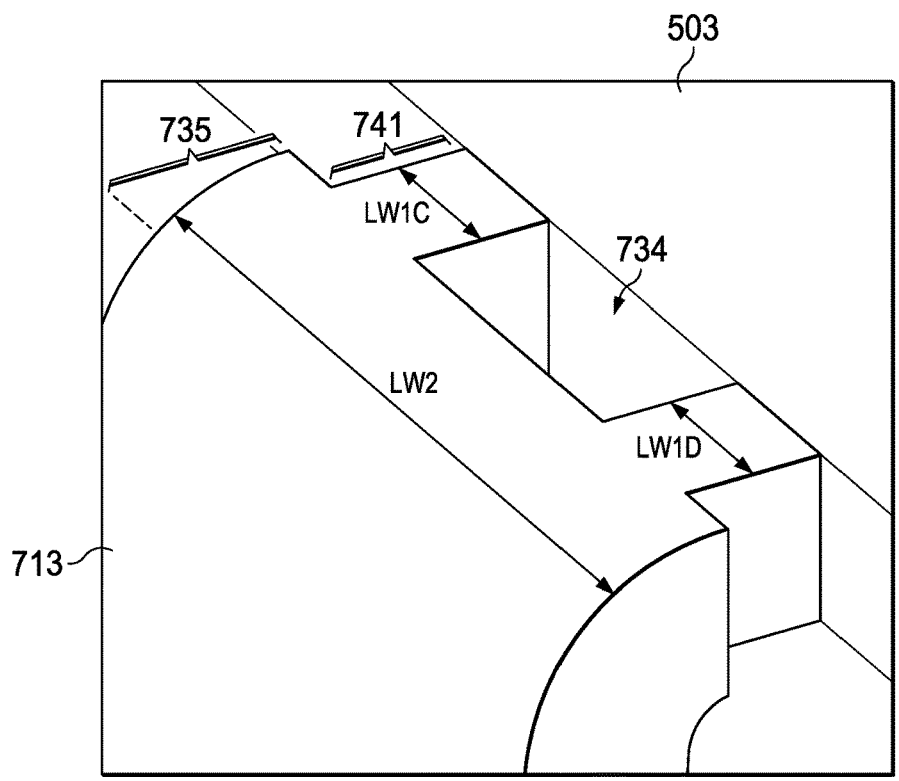

FIG. 7C illustrates in another projection view an additional alternative arrangement. In FIG. 7C, mold compound 503 forms the package body for a leaded semiconductor device package. Lead 713 has a first portion 741 with a slot 734 and with the remaining lead material in the first portion having two widths, LW and LW1D, the total lead width in the first portion 741 is the sum of these two lead widths. The first portion 741 of lead 713 is also narrowed as in FIG. 7A, so that the arrangement of FIG. 7C combines a narrower lead in the first portion as shown in FIG. 7A, with the slot of FIG. 7B, further reducing the total lead width in the first portion 741, while the second portion 736 of lead 713 has a lead width LW2, which is greater than the total width in the first portion 741. The first portion 741 has a lead width that is the sum of both lead widths LW1C and LW1D. Lead width LW2 can be about the same as LW2 in FIGS. 7A, 7B.

Figure 7D:
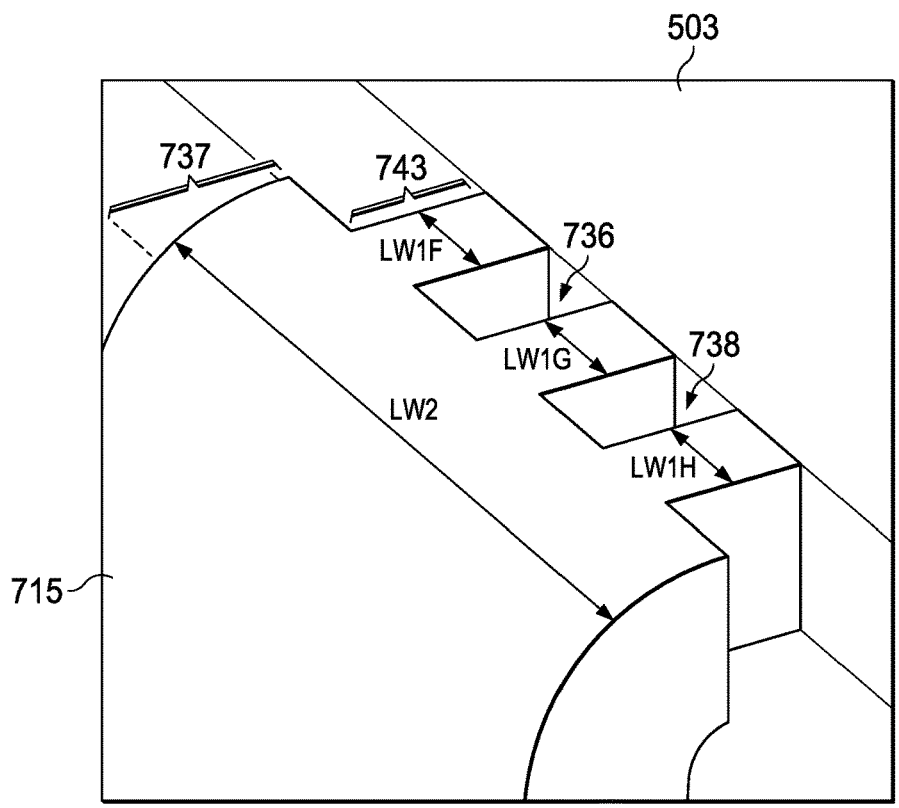

FIG. 7D illustrates in a close up projection view yet another alternative for leads in the arrangements. In FIG. 7D, the lead 715 has a first portion 743 with two slots 736, 738 extending through the lead 715. The remaining lead material in the first portion 743 forms three widths LW1F, LW1G, LW1H, with a total lead width in the first portion being the sum of LW1F, LW1G, LW1H. In addition, the first portion 743 is narrowed at the edges in a manner similar to the lead in FIG. 7A, so that the arrangement of FIG. 7D extends the arrangement of FIG. 7C by using multiple slots 736, 738. The second portion 737 of the lead 715 has a width LW2 that is greater than the total width of the lead material in the first portion 743, and width LW2 can be similar to the width LW2 in FIGS. 7A-7C. In the arrangements of FIGS. 7A-7D, the first portion of the leads has a total width that is less than the lead width of the second portion, and the smaller width of the first portion can be achieved by narrowing the first portion of the leads, by using one or more slots or openings in the first portion of the leads, or by combining these arrangements.

Figure 8A:
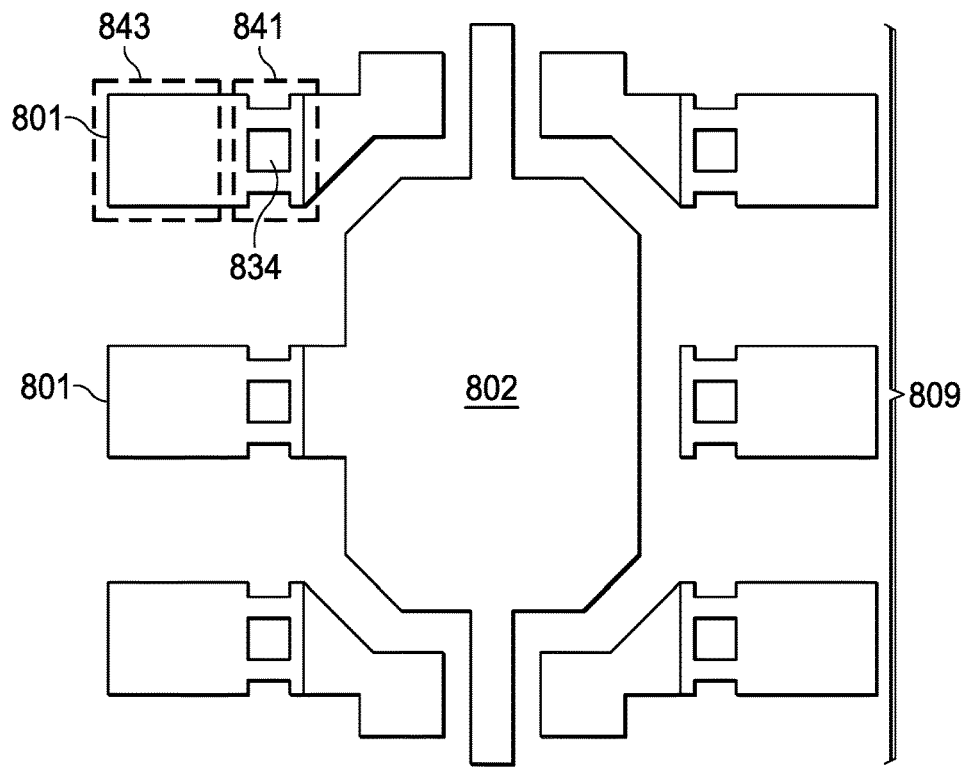
FIGS. 8A-8B illustrate a package substrate with leads and a leaded semiconductor device package of an arrangement, respectively.
Figure 8B:
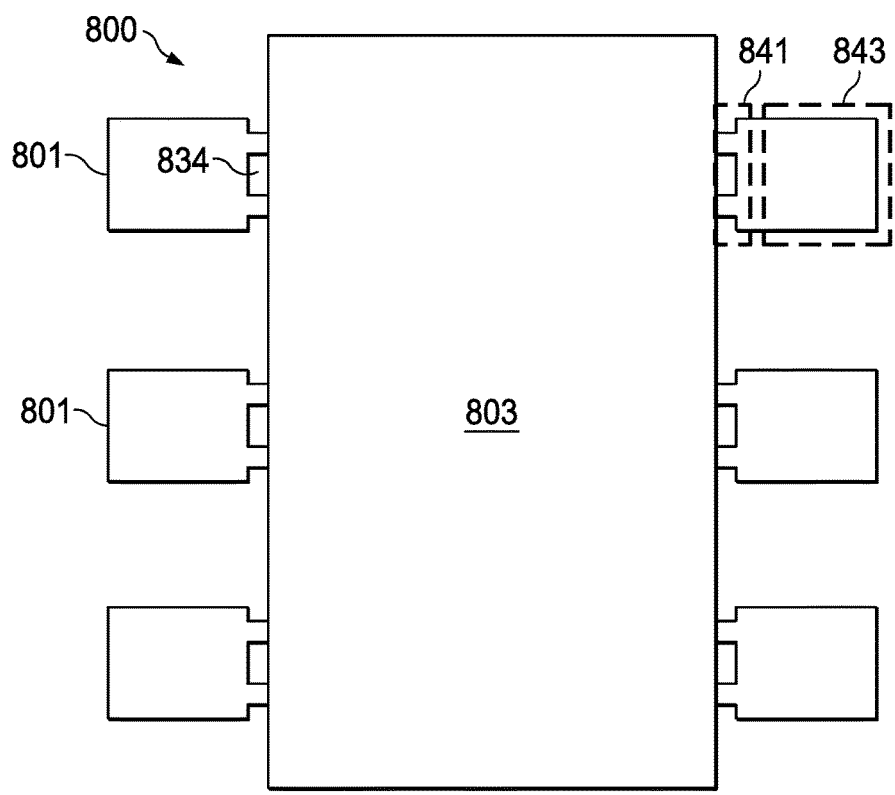

FIGS. 8A-8B illustrate a package substrate and a SOT leaded package for an example arrangement in top views. In FIG. 8A, a package substrate 809 is shown with leads 801 spaced from and extending away from a die pad 802. The leads 801 have a first portion 841 that is narrower in width than a second portion 843 and which includes a slot 834. The total width of the lead material in the first portion 841 is less than the width of the leads 801 in the second portion 843, this arrangement is similar to the lead shown in FIG. 7C, for example.

FIG. 8B illustrates a leaded semiconductor device package 800 formed using the package substrate of FIG. 8A. Mold compound 803 forms a package body with the leads 801 extending from the mold compound 803. The first portion 841 of the leads 801 that extends from the mold compound 803 includes a slot 834, and in the first portion 841 the leads 801 are narrowed when compared to the second portion 843, similar to the lead shape shown in FIG. 7C where both a slot and narrowed width in the first portion of a lead are shown.

Figure 9A:
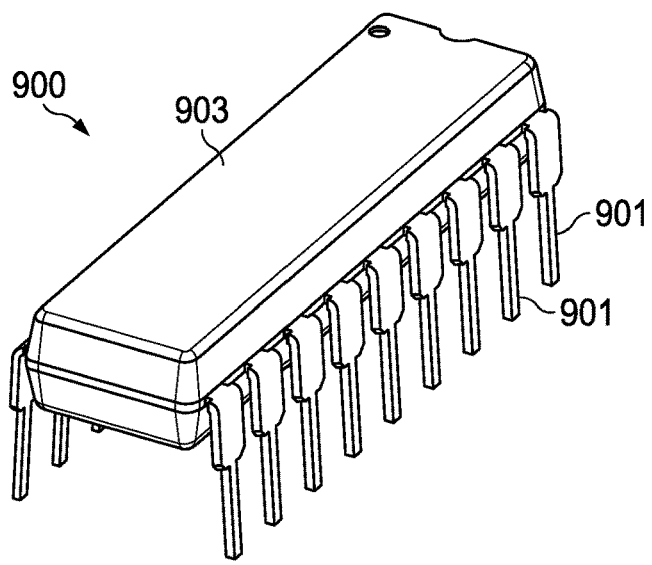
FIGS. 9A-9C illustrate a DIP package of an arrangement and two close up views of various leads used in the DIP package, respectively.
Figure 9B:
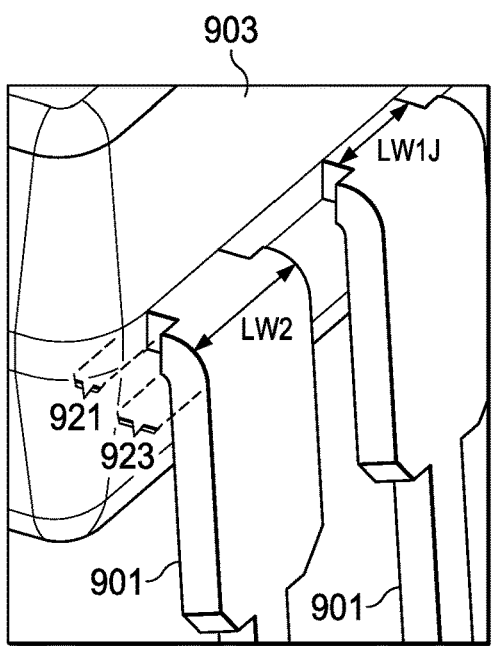
Figure 9C:
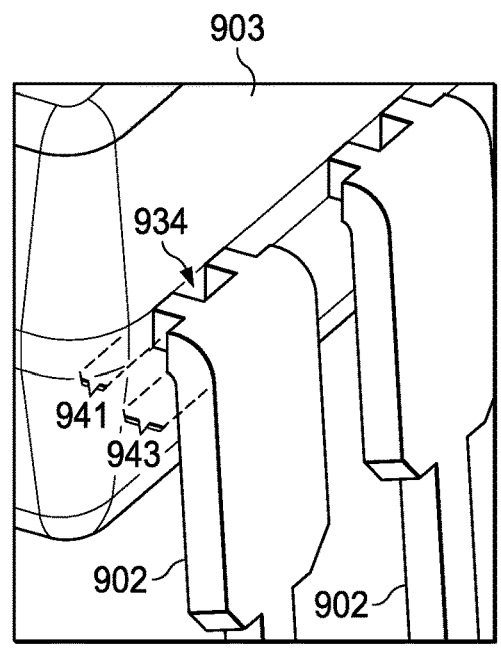

FIGS. 9A-9C illustrate in a projected view and close up views a dual in line package (DIP) in an alternative arrangement. FIG. 9A illustrates a DIP leaded semiconductor device package 900. Leads 901 extend from a package body formed of mold compound 903, with a first portion extending through the mold compound and to a second portion. To mount the DIP package 900, the leads 901 can be inserted into conductive holes and soldered, alternatively a DIP socket with conductive holes configured to receive the leads can be used.

FIG. 9B illustrates a close up view of leads 901 in FIG. 9A. In FIG. 9B, the first portion 921 of the leads 901 has a lead width LW1J that is less than the lead width LW2 of the second portion 923. The leads 901 are bent starting in the first portion and the leads then extend from the bend along the package body of mold compound 903 and in a direction normal to a board surface where the package will be mounted.

FIG. 9C illustrates a close up view of an alternative arrangement for the leads 901 in FIG. 9A. In FIG. 9C, the leads 902 have a first portion 941 that has a slot 934 and which are narrowed compared to a second portion 943, the leads 902 have a reduced width using an arrangement in the DIP package 900 that is similar to the lead shape shown in FIG. 7C.

Figure 10A:
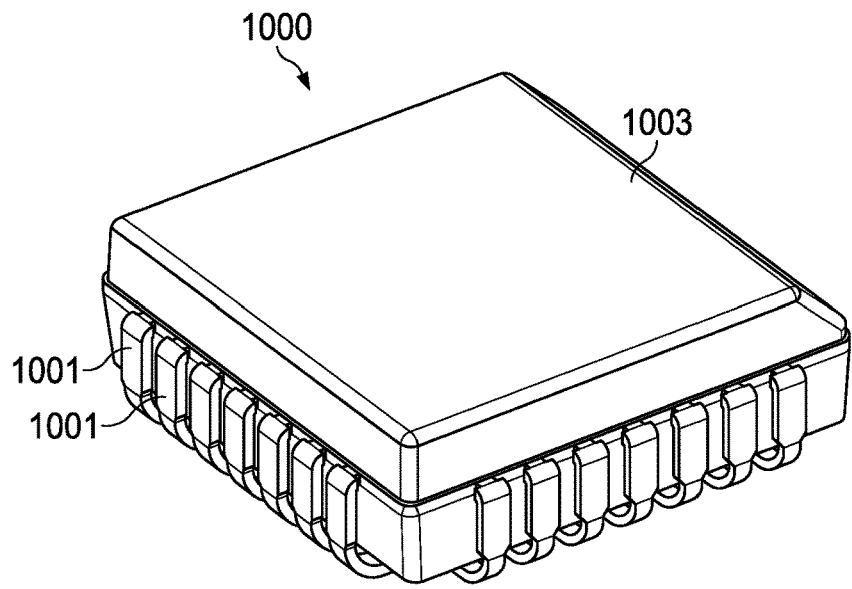
FIGS. 10A-10C illustrate a J-lead package of an arrangement and two close up views of various leads used in the J-lead package, respectively.
Figure 10B:
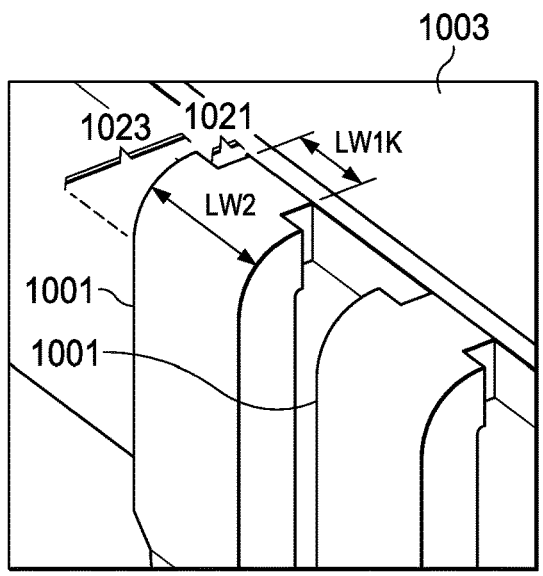
Figure 10C:
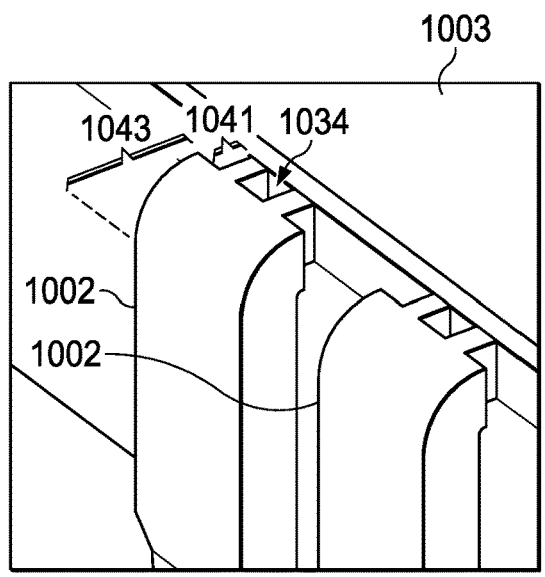

FIGS. 10A-10C illustrate, in a projection view and close up views, arrangements for a small outline J-lead (SOJ) leaded semiconductor device package 1000 using the arrangements. In FIG. 10A, the package 1000 is shown with a package body of mold compound 1003, and J-leads 1001 extending from the package body, along the sides of the package body and forming terminals beneath the package body formed by mold compound 1003.

FIG. 10B illustrates, in a close up view, an example lead 1001 for use with the J-lead package 1001 in FIG. 10A. The lead 1001 has a first portion 1021 that extends from a package body formed by mold compound 1003 with a lead width LW1K. The lead width LW1K that is less than the lead width LW2 for a second portion 1023. The lead 1001 has a shape similar to the example lead 701 shown in FIG. 7A.

FIG. 10C illustrates, in a close up view, an alternative lead shape for use with the J-lead package 1000 in FIG. 10A. In FIG. 10C, leads 1002 have a shape in a first portion 1041 that is similar to the shape shown in FIG. 7C, for example. In FIG. 10C, leads 1002 have a first portion 1041 with a slot 1034 and having narrowed width when compared to the second portion 1043. The first portion 1041 extends from the package body formed by mold compound 1003 and a bend begins in the first portion, the leads extend from the bend along the package body. By reducing the lead width for leads 1002 in the first portion 1041, the mechanical stress on the mold compound and on the wire bonds within the mold compound 1003 in the lead forming operations used to bend the leads 1002 are reduced compared to leads formed without the arrangements.

Figure 11:
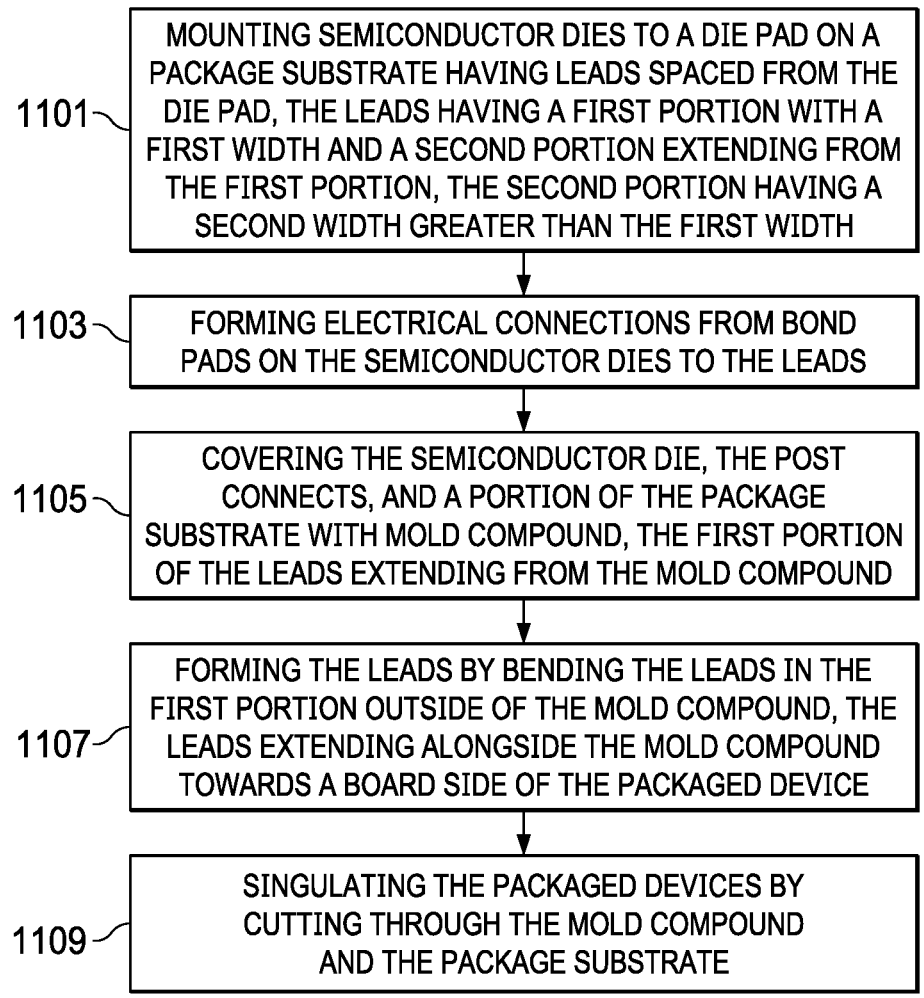
FIG. 11 illustrates in a flow diagram selected steps of a method for forming the arrangements.

FIG. 11 illustrates in a flow diagram selected steps of a method arrangement. At step 1101, the method begins by mounting a semiconductor die on a die pad on a package substrate with leads spaced from the die pad, the leads having a first portion with a first width and a second portion extending from the first portion, with the second portion having a second width that is greater than the first width (see FIGS. 5A-5B). At step 1103, the method continues by forming electrical connections from the bond pads on the semiconductor dies to the leads of the package substrate are formed, for example by wire bonding (see FIG. 5B). The method continues at step 1105 by covering the semiconductor die, the electrical connections, and portions of the package substrate with mold compound, while the first portion of the leads extends from the mold compound (see FIG. 5C). At step 1107, the method continues by forming the leads, bending the leads to form a first bend in the first portion. Because the leads have a smaller width in the first portion where the first bend is formed near the package body formed by the mold compound, the mechanical stress that is on the mold compound interface with the lead frame, and the wire bonds within the mold compound, is reduced (when compared to forming leads without the arrangements). At step 1109, the packaged semiconductor devices are separated by cutting through the package substrate and the mold compound in saw streets between the devices to separate the finished devices from the package substrate.

Use of the arrangements provide leaded semiconductor device packages with reduced or eliminated delamination defects and reduced bond wire pull off defects. The arrangements can be implemented using existing semiconductor die and package designs, and by making only slight modifications to existing lead frames, with no change to the footprint or surface mounting patterns for a system board that receives the finished packaged devices. Dimensions of the packaged devices are not changed by use of the arrangements. Use of the arrangements is low cost and packages formed using the arrangements are similar in cost to prior packaged devices. Simple modifications to the first portion of the leads in the leaded package requires no changes to bond wires, ball bond or stitch bond placement, die placement, and no changes to molds or equipment used.

The example packages illustrated in some of the drawings are leaded packages with five leads, for example, SOT packages are shown. Many other leaded package types can be used in additional arrangements. Dual in-line packages (DIPs), for example, can be used. Small outline integrated circuit (SOIC) packages can be used with the arrangements. J-lead packages, gull wing packages and other leaded packages can be used with the arrangements.

Modifications are possible in the described arrangements, and other alternative arrangements are possible within the scope of the claims.

What is claimed is:

1. An apparatus, comprising:
   a package substrate including a die pad and including leads spaced from the die pad surface;
   a semiconductor die mounted to the package substrate on the die pad, the semiconductor die having bond pads on an active surface;
   electrical connections coupling the bond pads of the semiconductor die to the leads;
   mold compound covering a portion of the package substrate, the semiconductor die, and the electrical connections, with the leads extending through the mold compound and having end portions exposed from the mold compound; and
   the end portions exposed from the mold compound including a first portion with a first width and extending with the first width from the mold compound to a second portion having a second width that is greater than the first width, wherein a distal end of the leads includes the second width.

2. The apparatus of claim 1, wherein the leads have a bend in the first portion and after the bend, the leads extend alongside a package body formed by the mold compound.

3. The apparatus of claim 2, wherein the bend is a first bend and the leads are gull wing leads that have a second bend in the second portion, and after the second bend the leads extend away from the package body formed by the mold compound, the leads having ends forming feet configured for surface mounting the leads to a board.

4. The apparatus of claim 2, wherein the apparatus is a dual in-line package (DIP).

5. The apparatus of claim 2, wherein the apparatus is a J-lead package.

6. The apparatus of claim 2, wherein the bend is a first bend and the leads are J-leads, the J-leads extending from the first bend alongside the mold compound towards a board side surface of the package, and the J-leads having a second bend and extending from the second bend to ends beneath the board side surface of the package.

7. The apparatus of claim 1, wherein the electrical connections are wire bonds.

8. The apparatus of claim 7, wherein the wire bonds are coupled to the bond pads using a ball bond at one end of the wire bonds, and are coupled to the leads using a stitch bond at an opposite end of the wire bonds.

9. The apparatus of claim 7, wherein the wire bonds are formed from bond wire selected from gold, copper, palladium coated copper (PCC), silver and aluminum.

10. The apparatus of claim 1, wherein the electrical connections are ribbon bonds.

11. The apparatus of claim 1, wherein the mold compound is a thermoset epoxy resin.

12. The apparatus of claim 1, wherein the first width is less than about 90% of the second width, and the second width is greater than about 5 mils.

13. The apparatus of claim 1, wherein the first width is less than about 90% of the second width.

14. The apparatus of claim 1, wherein the package substrate is a copper lead frame.

15. The apparatus of claim 1, wherein the package substrate is a metal lead frame.

16. The apparatus of claim 1 wherein the package substrate is a metal lead frame selected from copper, Alloy 42, stainless steel, steel, gold, aluminum, and alloys thereof.

17. An apparatus, comprising:
    a leaded semiconductor device package adapted to be surface mounted to a printed circuit board and having leads exposed from a mold compound, the leads adapted to be soldered to pads on the printed circuit board; the leaded semiconductor device package further comprising:
    a package substrate having a die pad and leads spaced from the die pad;
    a semiconductor die mounted to die pad, the semiconductor die having bond pads;
    electrical connections coupling the bond pads of the semiconductor die to the leads;
    the mold compound covering a portion of the package substrate, the semiconductor die, and the electrical connections, with the leads extending through the mold compound and having end portions exposed from the mold compound; and
    the end portions exposed from the mold compound including a first portion with a first width and extending with the first width from the mold compound to a second portion including a second width that is greater than the first width, wherein the leads end with an edge including the second width.

18. The apparatus of claim 17, wherein the leads are gull wing leads.

19. The apparatus of claim 18, wherein the packaged device is a small outline transistor (SOT) package.

20. The apparatus of claim 17, wherein the leads are J-leads.

21. The apparatus of claim 20, wherein the packaged device is a small outline J-lead (SOJ) package.

22. The apparatus of claim 17, wherein the packaged device is a dual in-line package (DIP).

23. A method, comprising:
    mounting a semiconductor die to a die pad of a package substrate, the package substrate having leads spaced from the die pad, the leads having a first portion with a first width and extending with the first width to a second portion with a second width greater than the first width wherein the leads end with an edge including the second width;
    forming electrical connections coupling the bond pads of the semiconductor die to the conductive leads;
    covering a portion of the package substrate, the semiconductor die, and the electrical connections with mold compound, with the first portion and the second portion of the leads extending from and exposed from the mold compound; and bending the leads in the first portion forming a bend outside a package body formed by the mold compound, the leads extending from the bend towards a board side surface of a package body formed by the mold compound.

24. The method of claim 23, and wherein the bend in the leads is a first bend and further comprising forming a second bend in the leads in the second portion, the second bend being opposite in direction from the first bend, the leads extending from the second bend away from the package body formed by the mold compound.

25. The method of claim 24, wherein the leads are gull wing leads.

26. The method of claim 23, wherein the bend is a first bend and further comprising forming a second bend in the leads, forming J-leads, the J-leads extending from the second bend to ends beneath the board side surface of the package body formed by the mold compound.

27. The method of claim 26, wherein the method forms a J-lead package.

28. The method of claim 23, wherein the method forms a dual in line package (DIP).

* * * * *